(12) United States Patent
Yeh et al.

(10) Patent No.: US 11,862,710 B2
(45) Date of Patent: Jan. 2, 2024

(54) VERTICAL TRANSISTOR INCLUDING SYMMETRICAL SOURCE/DRAIN EXTENSION JUNCTIONS

(71) Applicant: International Business Machines Corporation, Armonk, NY (US)

(72) Inventors: Chun-Chen Yeh, Danbury, CT (US); Alexander Reznicek, Troy, NY (US); Veeraraghavan Basker, Schenectady, NY (US); Junli Wang, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/569,669

(22) Filed: Jan. 6, 2022

(65) Prior Publication Data
US 2022/0130980 A1 Apr. 28, 2022

Related U.S. Application Data

(62) Division of application No. 16/797,097, filed on Feb. 21, 2020, now Pat. No. 11,239,343.

(51) Int. Cl.
*H01L 29/66* (2006.01)
*H01L 29/78* (2006.01)
(Continued)

(52) U.S. Cl.
CPC .... *H01L 29/66666* (2013.01); *H01L 21/2236* (2013.01); *H01L 29/0653* (2013.01);
(Continued)

(58) Field of Classification Search
CPC ..... H01L 21/823412; H01L 21/823487; H01L 21/823885; H01L 29/66818;
(Continued)

(56) References Cited

U.S. PATENT DOCUMENTS 9,525,064 B1 12/2016 Balakrishnan et al.
10,453,940 B1 * 10/2019 Mochizuki ........ H01L 29/66545
(Continued)

OTHER PUBLICATIONS

List of IBM Patents or Patent Applications Treated as Related; Date Filed: Jan. 6, 2022, 2 pages.

*Primary Examiner* — Victor A Mandala
*Assistant Examiner* — Lawrence C Tynes, Jr.
(74) *Attorney, Agent, or Firm* — CANTOR COLBURN LLP; Daniel Yeates

(57) ABSTRACT

A semiconductor device includes a first source/drain region on an upper surface of a semiconductor substrate that extends along a first direction to define a length and a second direction opposite the first direction to define a width. A channel region extends vertically in a direction perpendicular to the first and second directions from a first end contacting the first source/drain region to an opposing second end contacting a second source/drain region. A gate surrounds a channel portion of the channel region, and a first doped source/drain extension region is located between the first source/drain region and the channel portion. The first doped source/drain extension region has a thickness extending along the vertical direction. A second doped source/drain extension region is located between the second source/drain region and the channel portion. The second doped source/drain extension region has a thickness extending along the vertical direction that matches the first thickness.

14 Claims, 18 Drawing Sheets

(51) Int. Cl.
*H01L 21/223* (2006.01)
*H01L 29/06* (2006.01)

(52) U.S. Cl.
CPC .... *H01L 29/6653* (2013.01); *H01L 29/66545* (2013.01); *H01L 29/66553* (2013.01); *H01L 29/7827* (2013.01); *H01L 29/7834* (2013.01)

(58) Field of Classification Search
CPC ......... H01L 29/78696; H01L 29/78687; H01L 29/04–045; H01L 29/1041–105; H01L 29/7827; H01L 29/66666; H01L 29/6653; H01L 29/66553; H01L 27/2454
See application file for complete search history.

(56) References Cited

U.S. PATENT DOCUMENTS

| | | |
|---|---|---|
| 2019/0189745 A1 | 6/2019 | Balakrishnan et al. |
| 2019/0371920 A1* | 12/2019 | Xu .................... H01L 29/78684 |
| 2020/0052094 A1* | 2/2020 | Mochizuki ............ H01L 27/088 |
| 2021/0265488 A1 | 8/2021 | Yeh et al. |

* cited by examiner

VERTICAL TRANSISTOR INCLUDING SYMMETRICAL SOURCE/DRAIN EXTENSION JUNCTIONS

BACKGROUND

The present invention relates in general to semiconductor devices. More specifically, the present invention relates to fabrication methods and resulting structures for forming source/drain extension junctions in a vertical transport field effect transistor (VTFET).

Semiconductor devices are typically formed using active regions of a wafer. In an integrated circuit (IC) having a plurality of metal oxide semiconductor field effect transistors (MOSFETs), each MOSFET has a source and a drain that are formed in an active region of a semiconductor layer by incorporating n-type or p-type impurities in the layer of semiconductor material. A conventional geometry for MOSTFETs is known as a planar device geometry in which the various parts of the MOSFET device are laid down as planes or layers.

A VTFET is a non-planar FET that includes semiconductor fins and side-gates that can be contacted outside the active region, resulting in increased device density and some increased performance over lateral devices. In VTFETs the source to drain current flows in a direction that is perpendicular to a major surface of the substrate. For example, in a known VTFET configuration a major substrate surface is horizontal and a vertical fin extends upward from the substrate surface. The fin forms the channel region of the transistor. A source region and a drain region are situated in electrical contact with the top and bottom ends of the channel region. A gate is disposed on one or more of the fin sidewalls

SUMMARY

Embodiments of the invention are directed to a method of performing fabrication operations to form a method of forming a semiconductor device, the method comprises forming a channel region extending along a vertical direction with respect to an underlying substrate, and exposing a first channel portion of the channel region. The method further comprises exposing a second channel portion of the channel region and applying a single doping process that dopes the first channel portion and the second channel portion.

Embodiments of the invention are also directed to a method of forming a semiconductor device, the method comprising forming a first spacer stack on an upper surface of a first source/drain region, and forming a gate on an upper surface of the first spacer stack and forming a second spacer stack on an upper surface of the gate. The method further comprising forming a channel trench through the first spacer stack, the gate, and the second spacer stack, forming sacrificial gate spacers on sidewalls of the gate exposed by the channel trench, and forming a channel region in the channel trench. The method further comprises exposing a first channel portion of the channel region extending through the first spacer stack and exposing a second channel portion of the channel region extending through the second spacer stack. The method further comprising simultaneously converting the first channel portion of the channel region into a first source/drain extension region and converting the second channel portion of the channel region into a second source/drain extension region.

Embodiments of the invention are also directed to a semiconductor device includes a first source/drain region on an upper surface of a semiconductor substrate that extends along a first direction to define a length and a second direction opposite the first direction to define a width. A channel region extends vertically in a direction perpendicular to the first and second directions from a first end contacting the first source/drain region to an opposing second end contacting a second source/drain region. A gate surrounds a channel portion of the channel region, and a first doped source/drain extension region is located between the first source/drain region and the channel portion. The first doped source/drain extension region has a thickness extending along the vertical direction. A second doped source/drain extension region is located between the second source/drain region and the channel portion. The second doped source/drain extension region has a thickness extending along the vertical direction that matches the first thickness.

Additional features and advantages are realized through techniques described herein. Other embodiments and aspects are described in detail herein. For a better understanding, refer to the description and to the drawings.

BRIEF DESCRIPTION OF THE DRAWINGS

The subject matter which is regarded as embodiments is particularly pointed out and distinctly claimed in the claims at the conclusion of the specification. The foregoing and other features and advantages of the embodiments are apparent from the following detailed description taken in conjunction with the accompanying drawings in which:

FIGS. 1-18 depict multiple cross-sectional views of a semiconductor structure after various fabrication operations for forming symmetrical source/drain extension junctions in a VTFET, in which:

FIG. 1 depicts cross-sectional views of a starting semiconductor structure in accordance with aspects of the present invention;

FIG. 2 depicts a cross-sectional view of the semiconductor structure after additional fabrication operations in accordance with aspects of the present invention;

FIG. 3 depicts a cross-sectional view of the semiconductor structure after additional fabrication operations in accordance with aspects of the present invention;

FIG. 4 depicts a cross-sectional view of the semiconductor structure after additional fabrication operations in accordance with aspects of the present invention;

FIG. 5 depicts a cross-sectional view of the semiconductor structure after additional fabrication operations in accordance with aspects of the present invention;

FIG. 6 depicts a cross-sectional view of the semiconductor structure after additional fabrication operations in accordance with aspects of the present invention;

FIG. 7 depicts a cross-sectional view of the semiconductor structure after additional fabrication operations in accordance with aspects of the present invention;

FIG. 8 depicts a cross-sectional view of the semiconductor structure after additional fabrication operations in accordance with aspects of the present invention;

FIG. 9 depicts a cross-sectional view of the semiconductor structure after additional fabrication operations in accordance with aspects of the present invention;

FIG. 10 depicts a cross-sectional view of the semiconductor structure after additional fabrication operations in accordance with aspects of the present invention;

FIG. 11 depicts a cross-sectional view of the semiconductor structure after additional fabrication operations in accordance with aspects of the present invention;

FIG. 12 depicts a cross-sectional view of the semiconductor structure after additional fabrication operations in accordance with aspects of the present invention; and FIG. 13 depicts a cross-sectional view of the semiconductor structure after additional fabrication operations in accordance with aspects of the present invention;

FIG. 14 depicts a cross-sectional view of the semiconductor structure after additional fabrication operations in accordance with aspects of the present invention;

FIG. 15 depicts a cross-sectional view of the semiconductor structure after additional fabrication operations in accordance with aspects of the present invention;

FIG. 16 depicts a cross-sectional view of the semiconductor structure after additional fabrication operations in accordance with aspects of the present invention;

FIG. 17 depicts a cross-sectional view of the semiconductor structure after additional fabrication operations in accordance with aspects of the present invention; and FIG. 18 depicts a cross-sectional view of the semiconductor structure after additional fabrication operations in accordance with aspects of the present invention.

DETAILED DESCRIPTION

Figure 1:
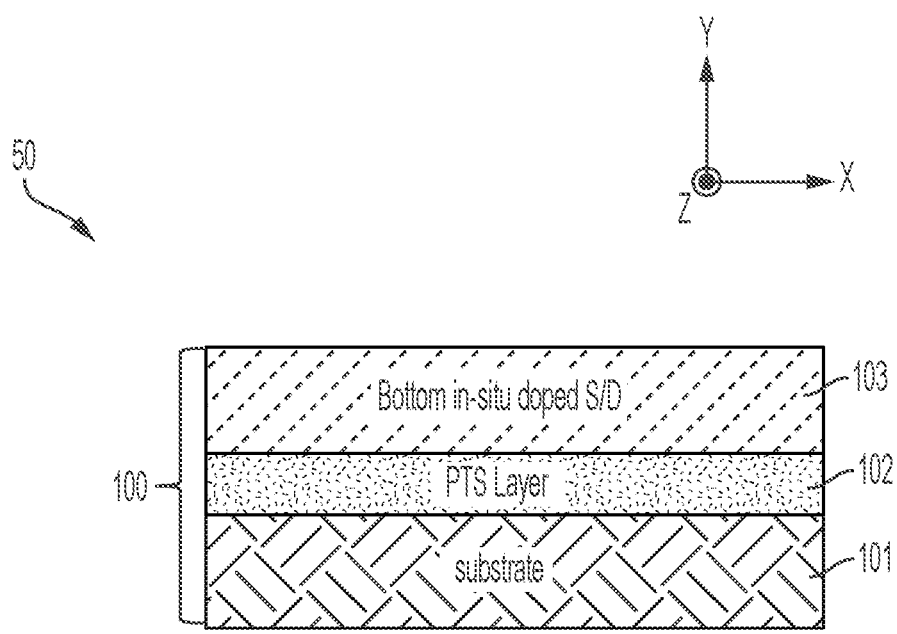

Although this detailed description includes examples of how aspects of the invention can be implemented to form a VTFET, implementation of the teachings recited herein are not limited to a particular type of FET structure or combination of materials. Rather, embodiments of the present invention are capable of being implemented in conjunction with any other type of transistor device or material, now known or later developed, wherein it is desirable to provide symmetrical source/drain extension junctions.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to a description of technologies that are more specifically relevant to the present invention, when a MOSFET is scaled down through various technology nodes, several techniques can be employed to improve device performance. One technique for scaling for 5 nanometer (nm) devices and beyond is to form a vertical transistor such as, for example, a vertical transport field effect transistor (VTFET). VTFETs can have longer gates, which can improve performance, and can be formed using a channel-first process flow. The channel-first process flow allows for defining the gate length and spacer thicknesses by reactive ion etch (ME) and/or chemical mechanical planarization (CMP). To further reduce channel access resistances, it is common to form so-called "extension" regions situated between the source/drain regions and the channel region.

One challenge of forming a VTFET using conventional methods is that there can be variations in the gate length, spacer thickness, and extension doping profile due to the integration challenges and geometrical constraints posed by the vertical orientation of the transistor. These geometrical constraints, in particular, have made it challenging to form source/drain extensions. Conventional process flows have attempted to overcome the VTFET geometrical constraints by forming and optimizing the bottom source/drain extension region separately from the top source/drain region. However, forming the extensions separately results in extension region misalignments known to cause undesired increases in resistance.

Turning now to an overview of aspects of the invention, embodiments of the invention provide fabrication methods and resulting structures for forming symmetrical source/drain extension junctions in a vertical transistor. In particular, embodiments of the invention employ self-aligned top and bottom spacers capable of facilitating symmetrical source/drain extension in a VTFET. Unlike conventional process flows, embodiments of the invention described herein form the top and bottom source/drain extensions simultaneously, which provides channel length variation (Leff) control while avoiding underlapped extension regions that contribute to increased resistance.

Turning now to a more detailed description of fabrication operations and resulting structures according to aspects of the invention, FIGS. 1-18 depict a semiconductor structure 50 after various fabrication operations for forming symmetrical source/drain extensions for use in a VTFET. For ease of illustration, the fabrication operations depicted in FIGS. 1-18 will be described in the context of forming the structure 50 into a single VTFET, it is intended that fabrication operations described herein apply equally to the fabrication of any number of VTFETs.

FIG. 1 depicts a cross-sectional view of a starting semiconductor structure 50 configured to include a semiconductor substrate 100 according to a non-limiting embodiment of the invention. With reference to the X/Y/Z diagram depicted in FIG. 1, the various elements that will form a completed VTFET device (not shown in FIG. 1) extend along a first axis (e.g., X-axis) to define width dimensions, and extend along a second axis (e.g., Y-axis) perpendicular to the X-axis to define height (or thickness) dimensions. Although not specifically depicted in a two-dimensional (2D) cross-sectional view shown in FIG. 1, the various elements that form the VFET device 100 also extend along a third axis (e.g., Z-axis) perpendicular to the first axis and the second axis to define depth dimensions.

The substrate 100 includes a base substrate 101, a punch through stop (PTS) layer 102, and a first doped source/drain layer 103. The substrate base 101 can be formed as a bulk substrate or a silicon-on-insulator (SOI) substrate, and can include one or more semiconductor materials. Non-limiting examples of suitable materials for the base substrate 101 include Si (silicon), strained Si, SiC (silicon carbide), Ge (germanium), SiGe (silicon germanium), SiGeC (silicon-germanium-carbon), Si alloys, Ge alloys, III-V materials (e.g., GaAs (gallium arsenide), InAs (indium arsenide), InP (indium phosphide), or aluminum arsenide (AlAs)), II-VI materials (e.g., CaSe (cadmium selenide), CaS (cadmium sulfide), CaTe (cadmium telluride), ZnO (zinc oxide), ZnSe (zinc selenide), ZnS (zinc sulfide), or ZnTe (zinc telluride)), or any combination thereof.

The PTS layer 102 interposed between the substrate base 101 and the first (or bottom) doped source/drain layer 103. The PTS layer 102 can be referred to as a "counter-doped layer", which includes a dopant that is different/opposite the dopant in the first doped source/drain layer 103. For example, when the first doped source/drain layer 103 includes a p-type dopant, the PTS layer 102 includes an n-type dopant, and when the first doped source/drain layer 103 includes an n-type dopant, the PTS layer 102 includes a p-type dopant. The thickness of the PTS layer 102 can range, for example, from about 5 to about 50 nm. The PTS layer 102 works together with the first doped source/drain layer 103 to permit proper electron//hole mobility through the final constructed device.

The first source/drain layer 103 is arranged on the substrate 101 over a counter-doped layer 102. The first source/drain layer 103 can be epitaxially grown from the PTS layer 102 and can be heavily doped with a dopant, which can be a p-type dopant (e.g., boron or gallium) or an n-type dopant (e.g., phosphorus or arsenic) so as to serve as a source region for a completed VTFET. In one or more non-limiting embodiments of the invention, the first source/drain layer 103 has a dopant concentration ranging, for example, from about 1019 to about 1022 atoms/cm. The thickness of the doped first source/drain 103 can range, for example, from about 50 nm to about 250 nm.

Figure 2:
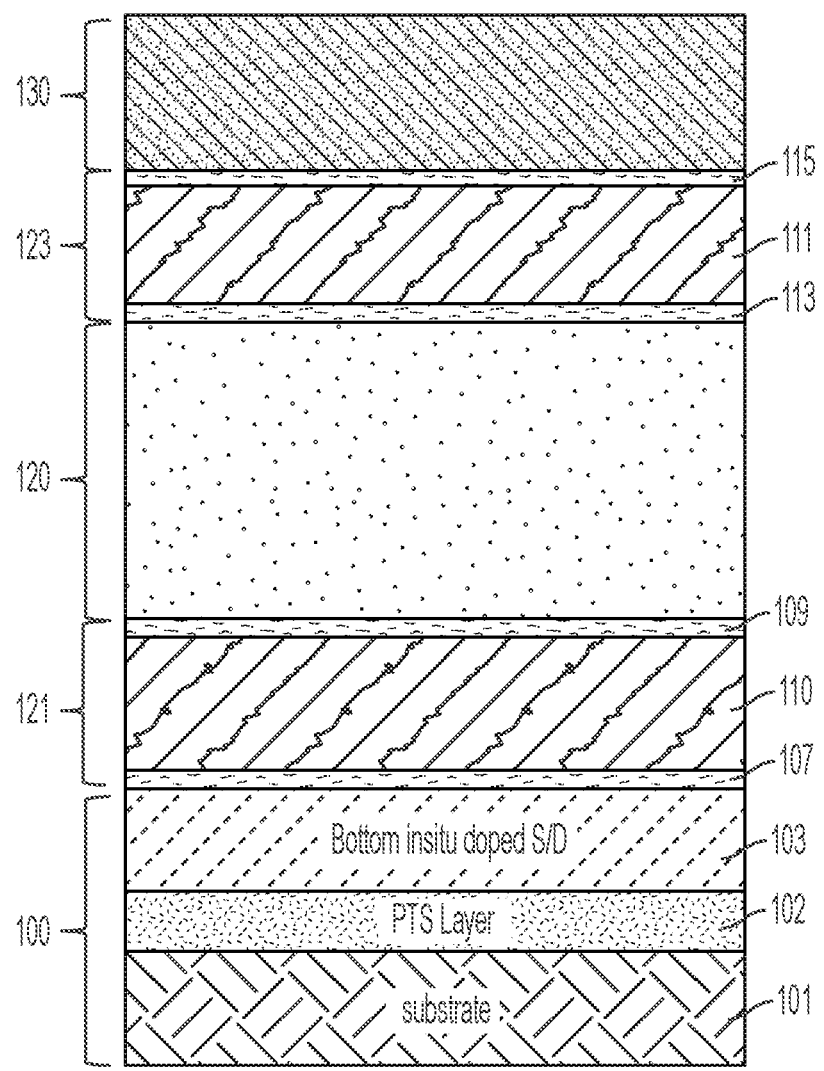

FIG. 2 depicts a cross-sectional view of the semiconductor structure 50 after having formed on the semiconductor substrate 100 a first gate 120 interposed between a first spacer stack 121 and a second spacer stack 123. The first spacer stack 121 is formed on an upper surface of the first source/drain layer 103 and includes a first spacer layer 110 interposed between a pair of opposing dielectric layers 107 and 109. The second spacer stack 123 is formed on an upper surface of the dummy gate 120, and includes a second spacer layer 111 interposed between a pair of opposing dielectric layers 113 and 115.

The first spacer layer 110 and second spacer layer 111 can each include an oxide material such as, for example, silicon dioxide ($SiO_2$), SiOCN, dielectric oxynitrides, or any combination thereof. The first spacer 110 and second spacer 111 materials are deposited by a deposition process, for example, chemical vapor deposition (CVD) or physical vapor deposition (PVD). The first spacer layer 110 and the second spacer layer 111 can have a thickness ranging, for example, from about 3 nm to about 15 nm. The thickness of the first and second spacer layers 110 and 111 assist in defining the thickness of subsequently formed source/drain extension regions (not shown in FIG. 2), which are described in greater detail below.

The dielectric layers 107, 109, 113, 115 included with the first and second spacer stacks can be formed from a nitride-based material, and can be deposited using various deposition processes including, but not limited to, CVD or PVD. The thickness of the dielectric layers 107, 109, 113, 115 can range, for example, from about 1 nm to about 20 nm The first gate 120 can be formed as a dummy gate 120 (sometimes referred to as a sacrificial gate) and includes a sacrificial gate material such as, for example, amorphous silicon (aSi) or polycrystalline silicon (polysilicon). The sacrificial material can be deposited by a deposition process, including, but not limited to, PVD, CVD, plasma enhanced chemical vapor deposition (PECVD), inductively coupled plasma chemical vapor deposition (ICP CVD), or any combination thereof. The sacrificial material forming the dummy gate 120 has a thickness ranging, for example, from about 8 nm to about 100 nm.

A capping layer 130 is formed on the second spacer stack 123 and over the dummy gate 120. Non-limiting examples of materials for the capping layer 130 include, but are not limited to, $SiO_2$, tetraethylorthosilicate (TEOS) oxide, high aspect ratio plasma (HARP) oxide, high temperature oxide (HTO), high density plasma (HDP) oxide, or nitride-based materials such as, for example, SiCN and SIBN. The capping layer 130 has a thickness in a range from about 30 to about 200 nm, or from about 50 to about 100 nm.

Figure 3:
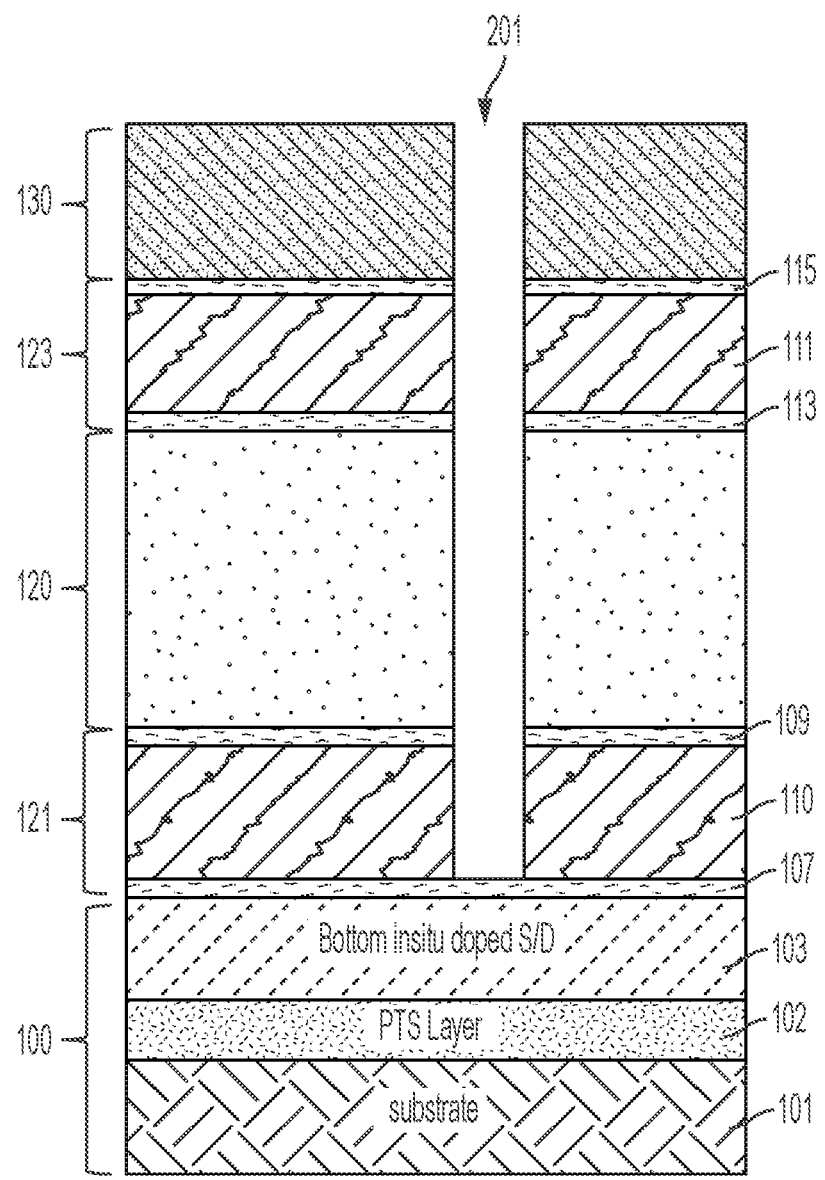

Turning to FIG. 3, a gate trench 201 is formed through the dielectric capping layer 130, second spacer 111, and the dummy gate 120, while stopping on an upper surface of dielectric layer 107. The gate trench 201 is formed by performing an etch process that is selective to (will not substantially remove) the material of dielectric layer 107. The etch process to form the gate trench 201 can include a single reactive ion etch (RIE) process, or multiple etching processes. The multiple etchings processes can include, for example, a first etching process is performed to remove a portion of the dielectric capping layer 130 selective to the material of the second spacer 111. A second etching process is then performed to remove a portion of the second spacer 111, which underlies the portion of the gate trench 201 formed from the first etching process, selective to the material of the dummy gate 120. A third etching process is then performed to remove a portion of the dummy gate 120, which underlies the portion of the trench 201 formed from the second etching process, selective to the material of dielectric layer 107. The resulting gate trench 201 extends through a top surface of the dielectric capping layer 130 down to a top surface of an exposed portion of dielectric layer 107. The width of the gate trench 201 can range, for example, from about 3 nm to about 20 nm, and the depth of the gate trench 201 can range from about 50 nm to about 300 nm.

Figure 4:
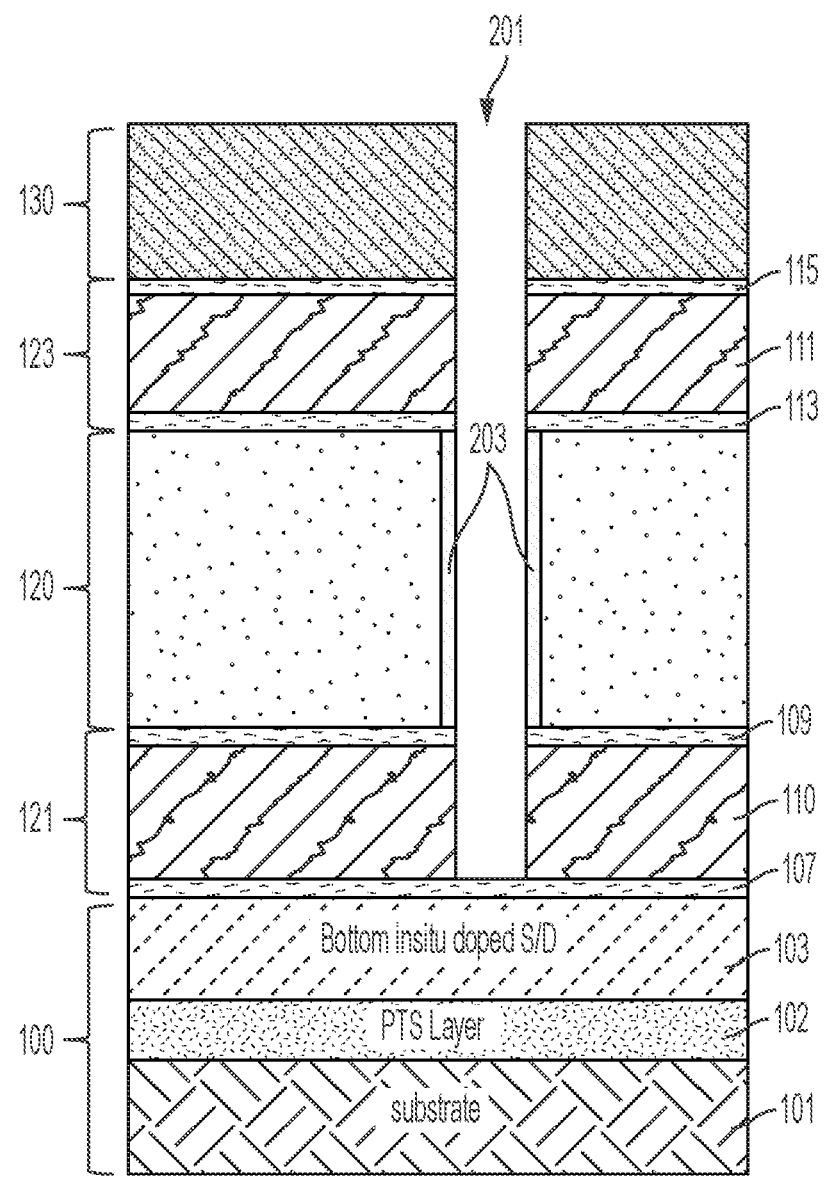

Referring to FIG. 4, self-aligned dummy gate spacers 203 are formed on sidewalls of the dummy gate 120. Various oxidation techniques such as plasma oxidation, for example, can be performed to form the self-aligned dummy gate spacers 203 on the dummy gate 120. In one or more non-limiting embodiments, a high-density plasma (HDP) can be applied to the dummy gate, which can oxidize a portion of the dummy gate sidewalls to form the dummy gate spacers 203, while dielectric layer 107 prevents oxidation of the underlying source/drain layer 103. The gate spacers can have a thickness ranging, for example, from about 2 nm to about 20 nm.

Figure 5:
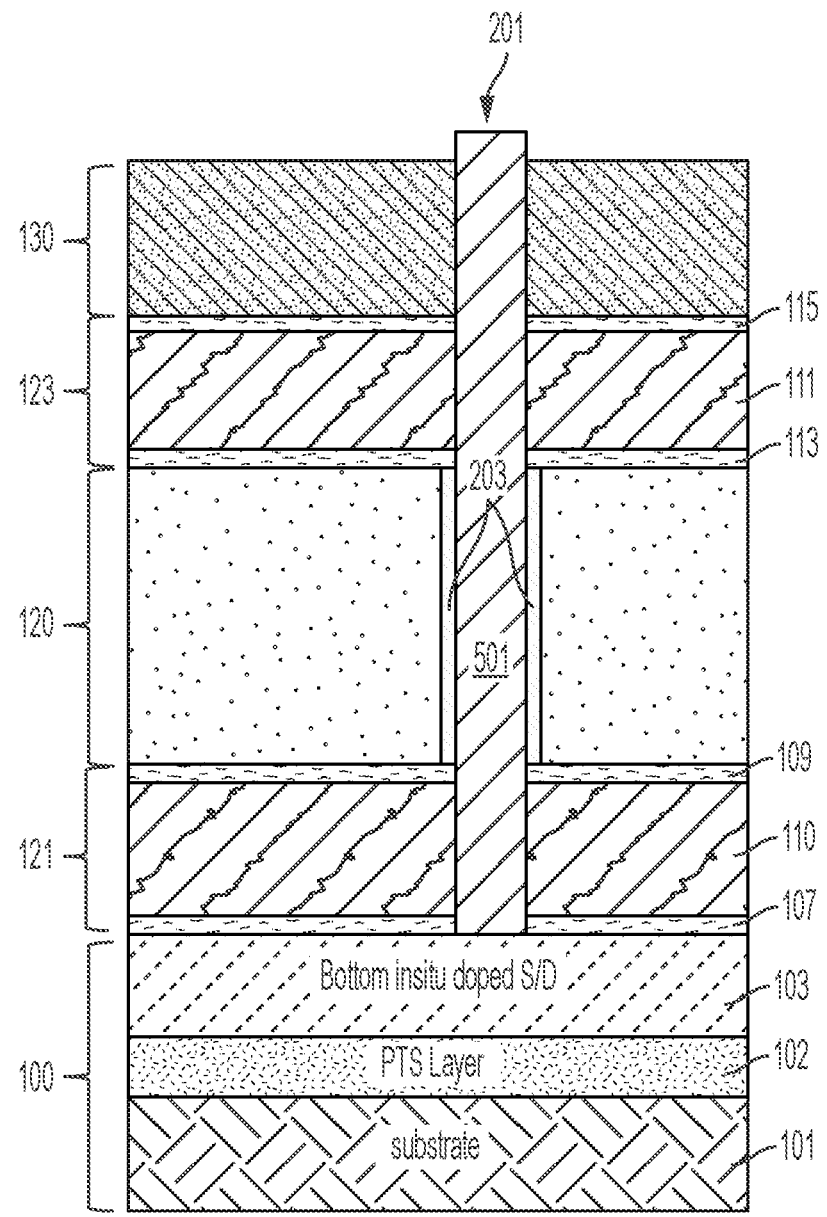

Turning now to FIG. 5, a portion of the dielectric layer 107 exposed by the gate trench 201 is etched away to expose the underlying source/drain layer 103 and an epitaxial channel 501 is formed in the trench. The gate trench 201 can be etched away using a process that is selective to (will not substantially remove) the first source/drain layer 103 material. For example, the dielectric layer 107 can be etched using a RIE process that employs a chemical composition that attacks the dielectric layer 107 without substantially attacking the remaining materials.

The epitaxial channel 501 includes an epitaxial semiconductor material, which can be grown from the exposed portion of the first source/drain layer 103. The epitaxial growth in the epitaxial channel 501 extends over the dielectric capping layer 130. The epitaxial channel 501 can be grown using a suitable growth process, for example, CVD, liquid phase (LP) or reduced pressure chemical vapor deposition (RPCVD), vapor-phase epitaxy (VPE), molecular-beam epitaxy (MBE), liquid-phase epitaxy (LPE), metal organic chemical vapor deposition (MOCVD), or other suitable processes.

The sources for the material of the epitaxial channel 501 can include, for example, silicon, germanium, or a combination thereof. The gas source for the deposition of epitaxial semiconductor material can include a silicon-containing gas source, a germanium-containing gas source, or a combination thereof. For example, an epitaxial silicon layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. An epitaxial silicon germanium alloy layer can be formed utilizing a combination of such gas sources. Carrier gases like hydrogen, nitrogen, helium and argon can be used.

Figure 6:
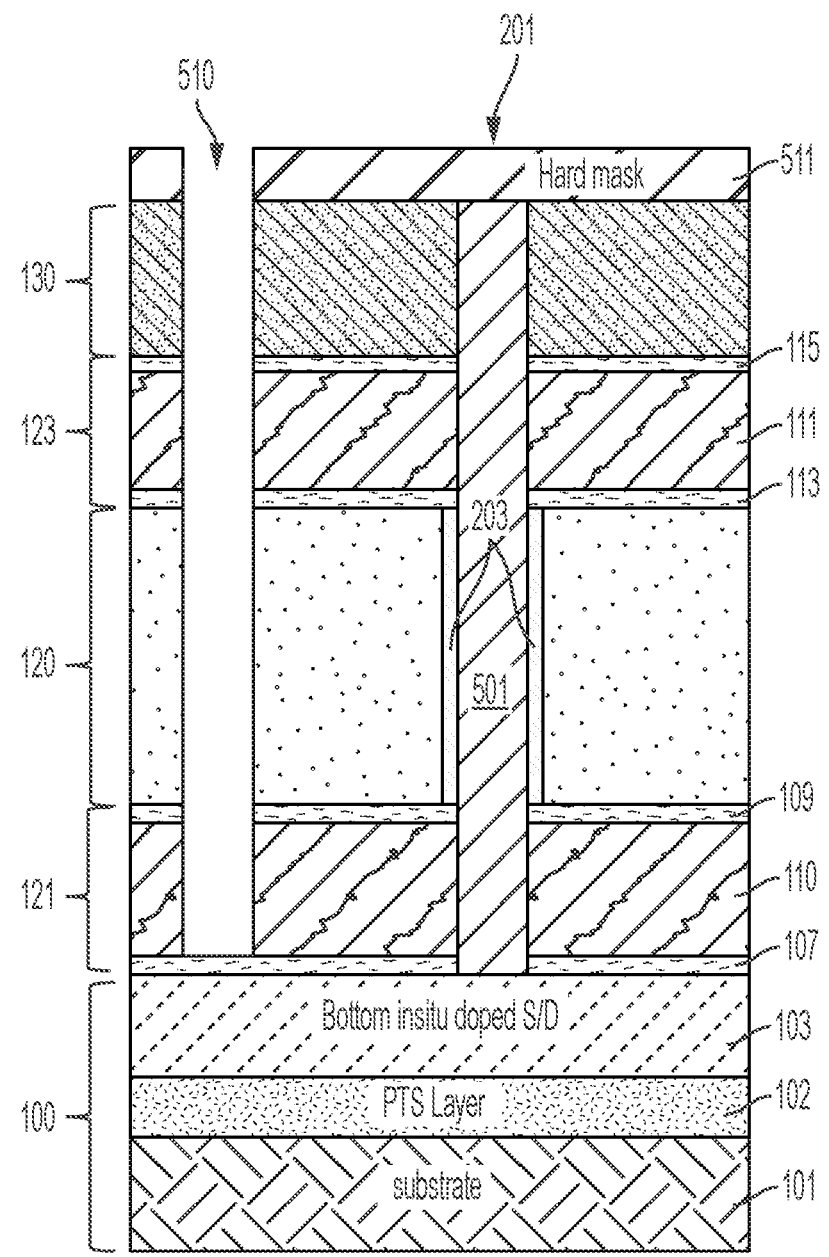

With reference now to FIG. 6, an access trench 510 is formed through the dielectric capping layer 130 and continues until stopping on the upper surface of the first spacer layer 110. Accordingly, a portion of the dielectric layer 107 is exposed by the access trench 510. The access trench 510 can be formed using known lithography techniques which include, for example, patterning a mask layer 511 formed on the upper surface of the capping layer 123, and transferring the pattern through the capping layer, second spacer stack 123, dummy gate 120 and the first spacer stack 121 until stopping on the upper surface of dielectric layer 107. A RIE processes selective to the dielectric layer 107 can be used to transfer the pattern so as to form the access trench 510. Accordingly, the access trench 510 provides access (i.e., exposes) the first spacer 110 and the second spacer 111.

Figure 7:
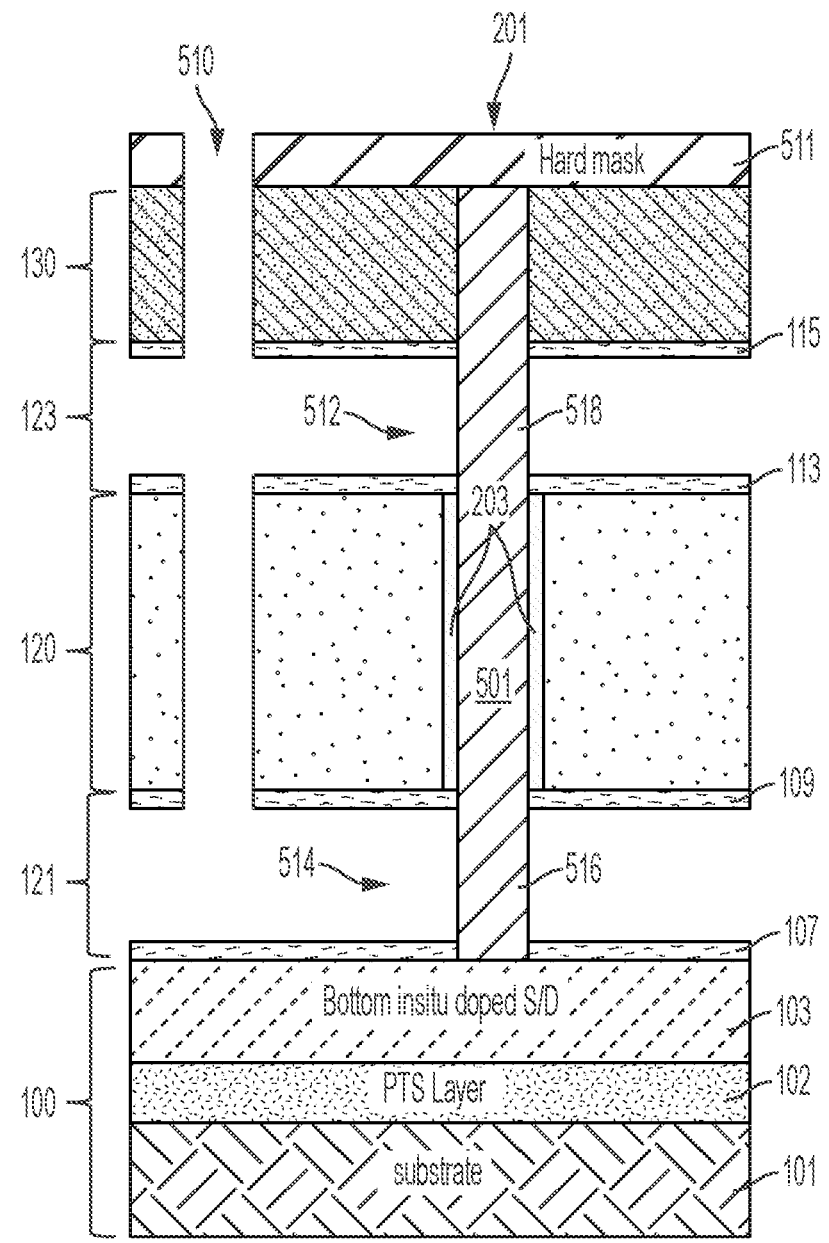

Referring to FIG. 7, the first spacer 110 and second spacer 111 are removed so as to from a first spacer void 512 and a second spacer voids 514. An etching technique including a hydrofluoric-based (HF-based) chemistry can be performed to remove the first and second spacers 110 and 111. Accordingly, the first and second spacer voids 512 and 514 provide access (i.e., expose) to a first portion 516 and a second portion 518 of the epitaxial channel 501, which will be utilized to form first and second source/drain extension regions, respectively.

Figure 8:
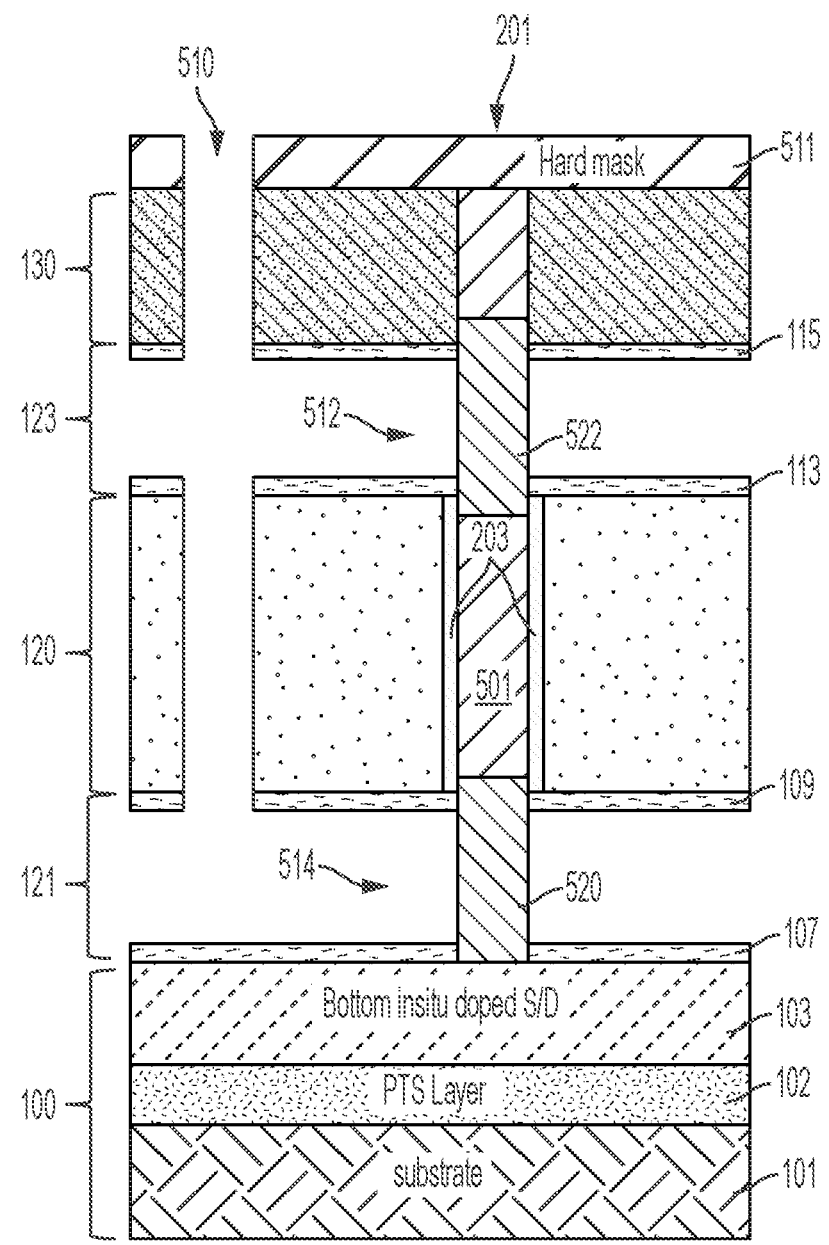

Turning to FIG. 8, the first exposed portion 516 of the epitaxial channel 501 is converted into a first (e.g., lower) source/drain extension region 520 and the second exposed portion 518 is converted into a second (e.g., upper) source/drain extension region 522. A plasma doping technique can be performed to the form the first and second source/drain extension regions 520 and 522. When forming an NFET devices, the first and second source/drain extension regions 520 and 522 can be doped with arsenic (As), phosphorus (P) or aluminum (Al). When forming a PFET device the first and second source/drain extension regions 520 and 522 can be doped with boron (B), boron trifluoride (BF3) or gallium (Ga). In either case, the dopant concentration can range, for example, from about 5E19 atm/cm3 to about 1E21 atm/cm3. Accordingly, a dopant concentration of the first and second source/drain extension regions 520 and 522 is different from a doping concentration, if any, of the non-plasma doped channel region (e.g., channel portion 501).

Unlike conventional process flows that form one source/drain region separately (i.e., at separate and different times or at different stages of the process flow) from the other source/drain region, the access trench 510 facilitates simultaneous doping of the first exposed portion 516 and the second exposed portion 518 to simultaneously form the first and second source/drain extension regions 520 and 522. In addition, the dummy gate spacers 203 allow for forming first and second source/drain extension regions 520 and 522 having matching thicknesses, i.e., distances extending along the vertical direction of the channel region 501. Accordingly, the first source/drain extension region 520 (e.g., the lower source/drain extension region) is formed to be self-aligned with respect to the second source/drain extension region 522 (e.g., the upper source/drain extension region).

Figure 9:
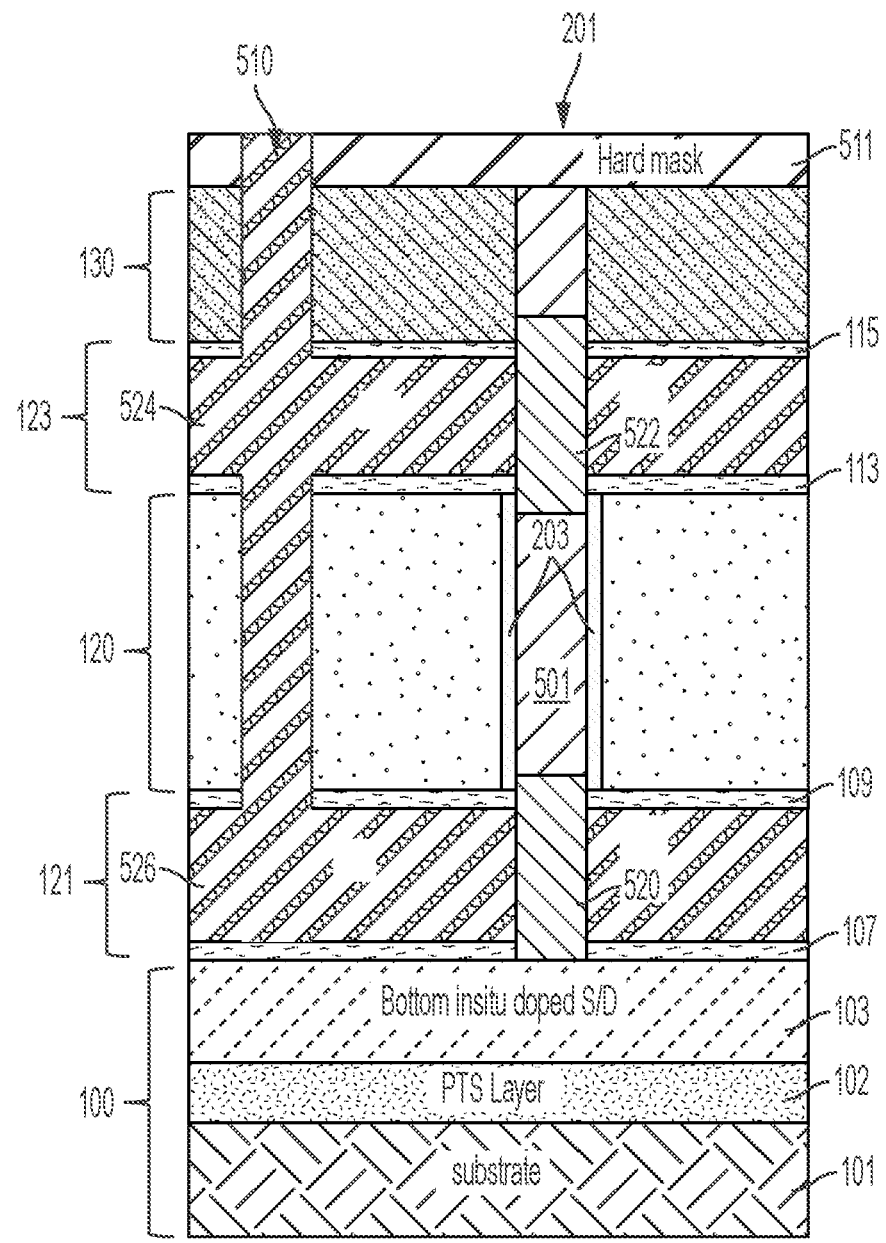

Referring to FIG. 9, the access trench 510 along with the spacer voids 512 and 514 are filled with a dielectric fill material 524. The dielectric fill material 524 can include, but is not limited to, $SiO_2$. Filling the access trench 510 forms a first dielectric portion 526 and a second dielectric portion 528. The first dielectric portion 526 is interposed between dielectric layers 107 and 109, and surrounds the first source/drain extension region 520. The second dielectric portion 528 is interposed between dielectric layers 113 and 115, and surrounds the second source/drain extension region 522. The dielectric fill material can be deposited before or after removing the mask 511. When depositing the dielectric fill material 524 before removing the mask 511, a CMP process can be performed to recess any overflow dielectric material along with the mask 511. The dielectric fill material 524 can be deposited using various deposition processes including, but not limited to, CVD. In one or more non-limiting embodiments of the invention, excess dielectric fill material 524 located on the upper surface of the capping layer 123 can be removed using a CMP process.

Figure 10:
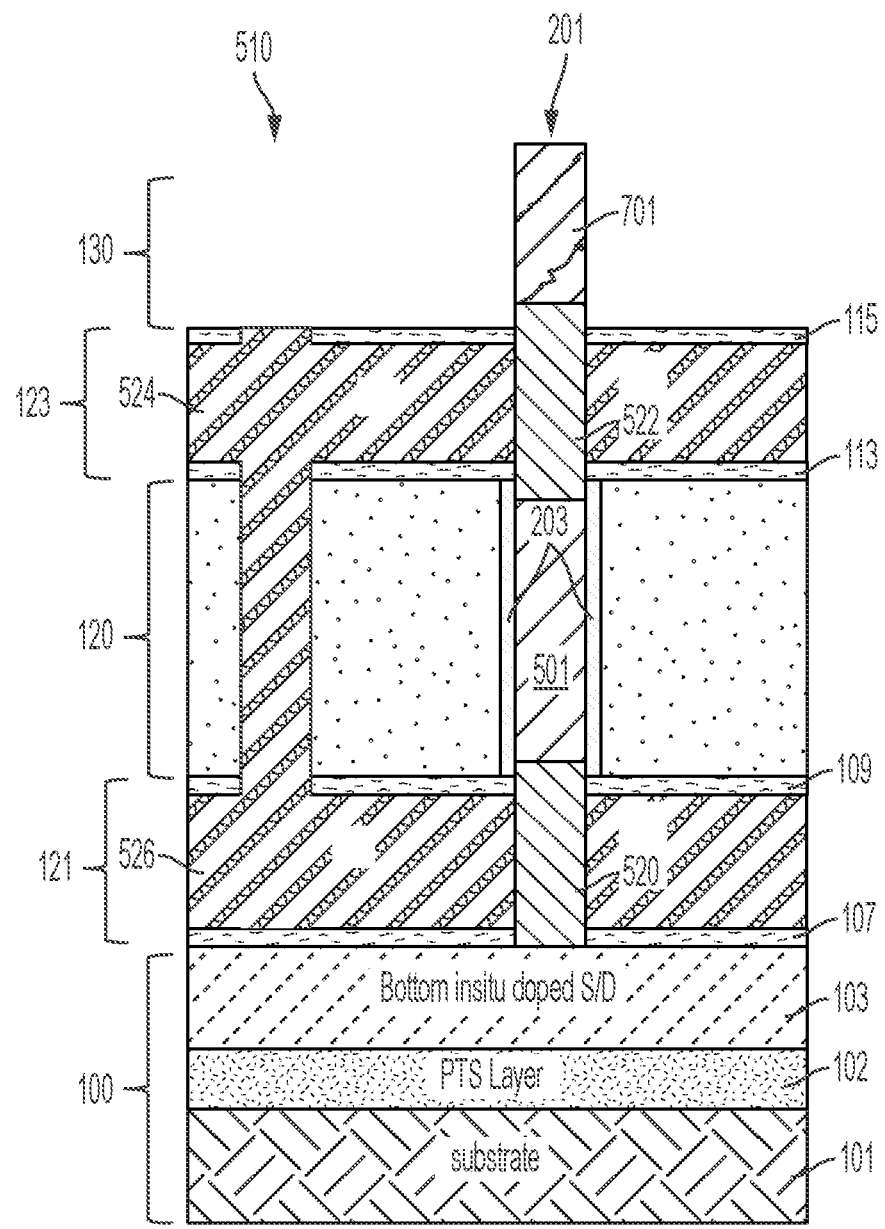

Turning to FIG. 10, a channel cap 701 is formed on the channel 501. In some embodiments of the invention, the capping layer 123 is removed and the exposed upper portion of the channel 501 is converted into a channel cap 701. The channel 701 can be formed by oxidizing the upper portion of the channel 501 to form an oxide-based channel cap 701 such as, for example, a $SiO_2$ channel cap 701. In other embodiments of the invention, the channel cap 701 can be formed by recessing an upper portion of the channel 501 to form a void (not shown) in the capping layer 123. The void is then re-filled with a dielectric material such as, for example, an oxide material or nitride material, to form the channel cap 701.

Figure 11:
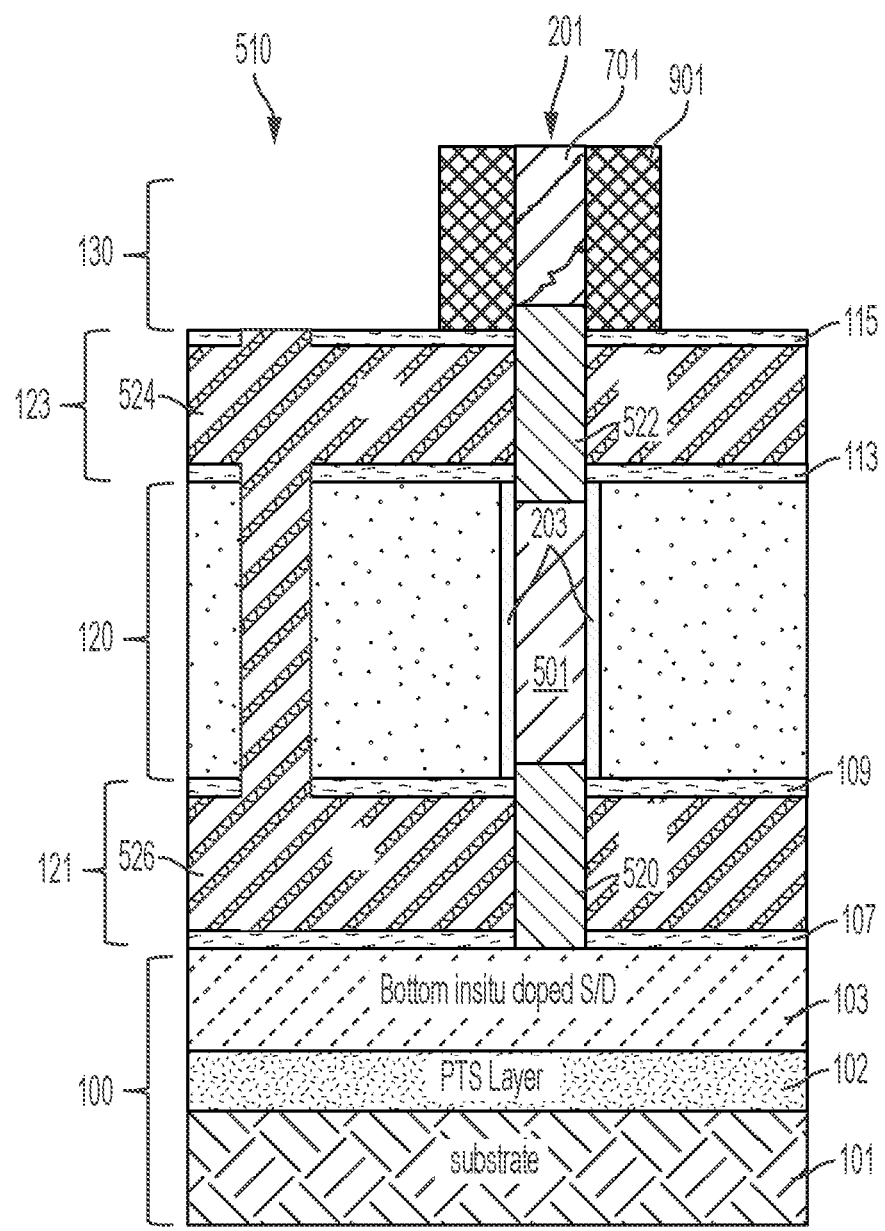

Turning to FIG. 11, a top spacer 901 is formed on the upper surface of dielectric layer 115 and on the sidewalls of an exposed portion of the upper source/drain region and channel cap 701. In some embodiments of the invention, excess portions of the top spacer 901 can be recessed from the upper portion of the channel cap 701 using a CMP process. Accordingly, the top spacer 901 can protect the upper source/drain extension region 520 and the channel cap 701 from subsequent process flow etching processes.

The top spacer 901 includes an insulating material, for example, dielectric oxides such as, for example $SiO_2$, which can be deposited on the upper surface of dielectric layer 115 using various known deposition processes such as, for example, CVD or PVD. The deposited top spacer material can then be patterned according to a lithography/etching process. The top spacer material can be etched using a dry etch process such as a RIE process, for example, while stopping on an upper surface of the dielectric layer 115. The remaining top spacer 901 can have a width ranging, for example, from about 5 nm to about 50 nm. Accordingly, the top spacer 901 itself can be used as a hardmask for performing a subsequent etching process.

Figure 12:
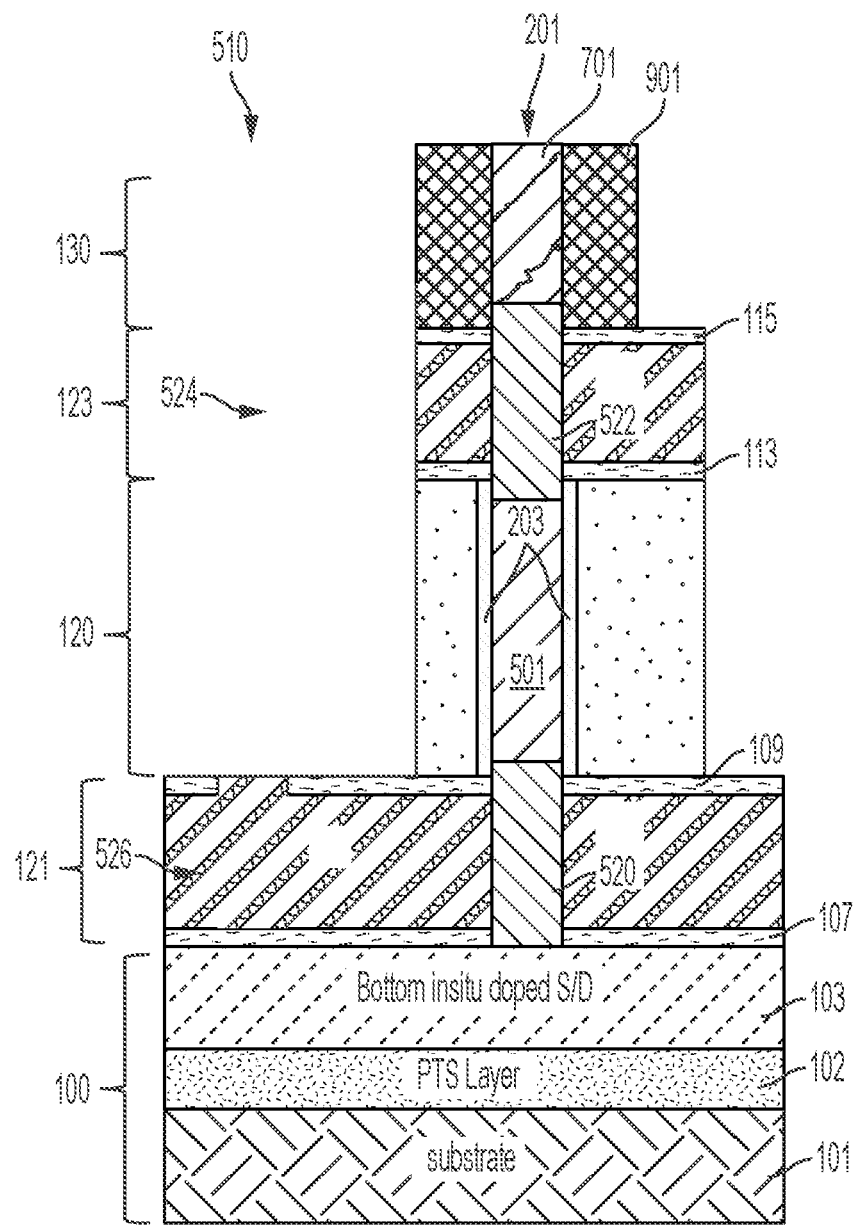

Referring now to FIG. 12, portions of the second spacer stack 123 and dummy gate 120 are recessed to trim the dummy gate 120. More specifically, the second spacer 111 and the dummy gate material 120 are recessed to removed portions that extend laterally beyond the spacer 901 material. A dry etch process such as, for example, a RIE process, that is selective to (will not substantially remove) dielectric layer 109 is performed to remove portions of the second spacer stack 123 and dummy gate 120 not covered by the top spacer 901, while stopping on the upper surface of dielectric layer 109.

Figure 13:
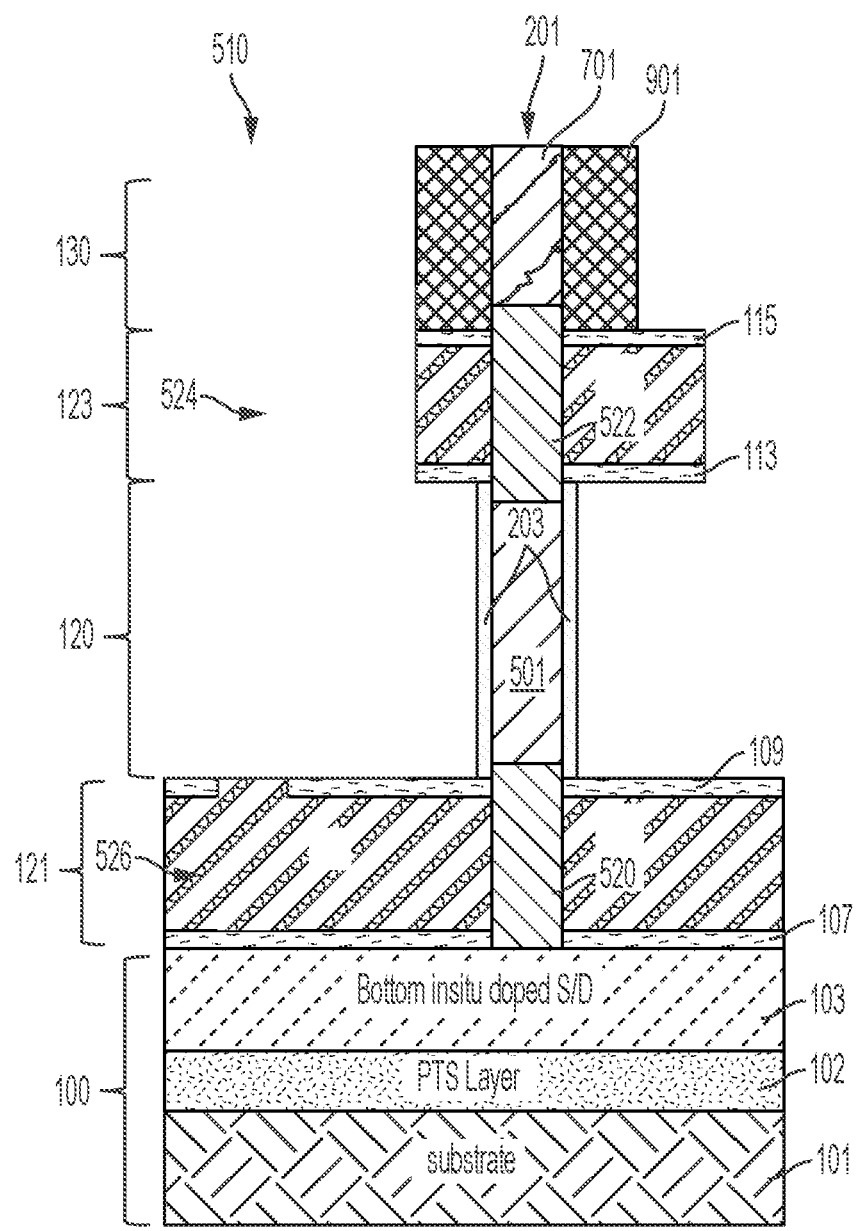

Referring to FIG. 13, the remaining portion of the dummy gate 120 located beneath the remaining portion of the second spacer stack 123 is removed (i.e. "pulled) to expose the dummy gate spacers 203. The dummy gate 120 can be removed using a wet etch process, for example, that is selective to (will not substantially remove) the dummy gate spacers 203 and dielectric layers 109 and 115. In some embodiments of the invention, the wet etch chemistry includes high-temperature ammonia ($NH_3$).

Figure 14:
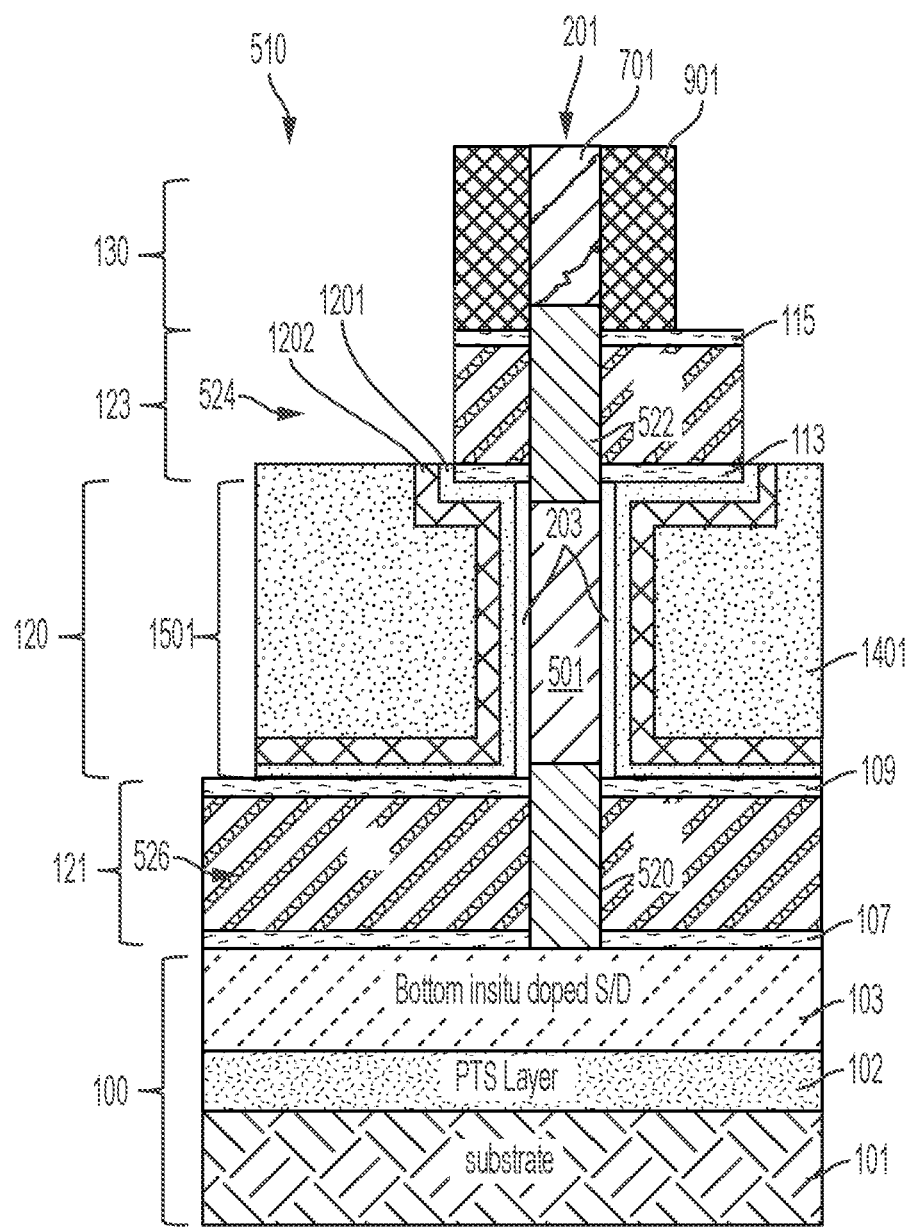

Turning now to FIG. 14, the dummy gate spacers 203 (see FIG. 13) are removed before depositing a gate dielectric material 1201, a work function metal 1202 and a metal gate material 1401. The gate dielectric material 1201, the work function metal 1202, and metal gate material 1401 form a portion of a gate stack 1501 that replaces the dummy gate 120. In accordance with standard VTFET architectures, various elements of a VTFET (e.g., the bottom spacer layer 110, gate dielectric 1201, gate stack 1501, top spacer layer 111, and top S/D region 1801) extend completely around the sidewalls of the channel in the X, Y, and Z directions.

The gate dielectric material 1201 and the work function metal 1202 can be deposited such they conform to the upper surface of dielectric layer 109, along with the epitaxial channel 501, remaining portions of the second spacer stack 11 and the top spacer 901. Thereafter, portions of the gate dielectric material 1201 and work function metal 1202 can be removed from the top spacer 901 and second spacer stack 11 as further shown in FIG. 14. In one or more embodiments of the invention, an anisotropic etch such as a RIE process, for example, can be performed recess the gate dielectric material 1201 and the work function metal 1202 while stopping on the upper surface of the metal gate material 1401.

The gate dielectric material(s) can be a dielectric material having a dielectric constant greater than 3.9, 7.0, or 10.0. Non-limiting examples of suitable materials for the gate dielectric material 1201 include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material can further include dopants such as, for example, lanthanum and aluminum. The gate dielectric material 1201 layer can be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the gate dielectric material 1201 can vary depending on the deposition process as well as the composition and number of high-k dielectric materials used.

The work function metal(s) 1202 deposited over the gate dielectric material 1201 can be chosen based on the type of transistor. Non-limiting examples of suitable work function metals 1202 include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof. The work function metal(s) 1202 can be deposited by a suitable deposition process, for example, CVD, PECVD, PVD, plating, thermal or e-beam evaporation, and sputtering.

The metal gate material 1401 is a conductive gate metal that is deposited over the gate dielectric material(s) 1201 and work function metals 1202 to form the gate stack 1501. Non-limiting examples of suitable conductive metals include aluminum (Al), platinum (Pt), gold (Au), tungsten (W), titanium (Ti), or any combination thereof. The conductive metal can be deposited by a suitable deposition process, for example, CVD, PECVD, PVD, plating, thermal or e-beam evaporation, and sputtering. A planarization process, for example, chemical mechanical planarization (CMP), is performed to polish the surface of the conductive gate metal material 1401.

Figure 15:
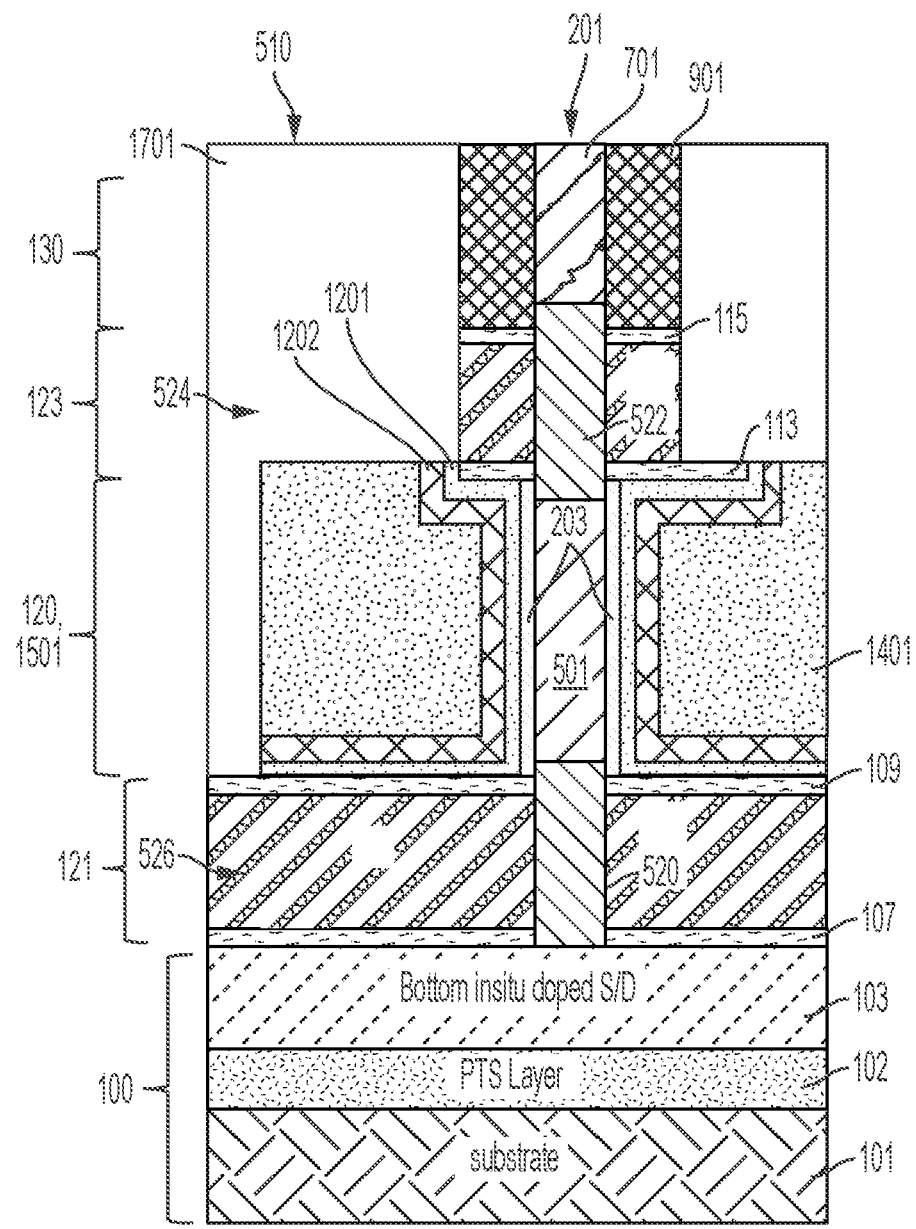

Referring to FIG. 15, an interlayer dielectric (ILD) 1701 is deposited on the gate stack 1501 and is planarized using a CMP process, for example, until stopping on the upper surface of the top spacer 901. The ILD 1701 can be formed from, for example, a low-k dielectric material, which can be defined as having a dielectric constant (k) that is less than about 4.0. The low-k material can included, but is not limited to, $SiO_2$, spin-on-glass, a flowable oxide, a high density plasma oxide, borophosphosilicate glass (BPSG), or any combination thereof. The ILD layer 1701 is deposited by a deposition process, including, but not limited to CVD, PVD, plasma enhanced CVD, atomic layer deposition (ALD), evaporation, chemical solution deposition, or like processes.

Figure 16:
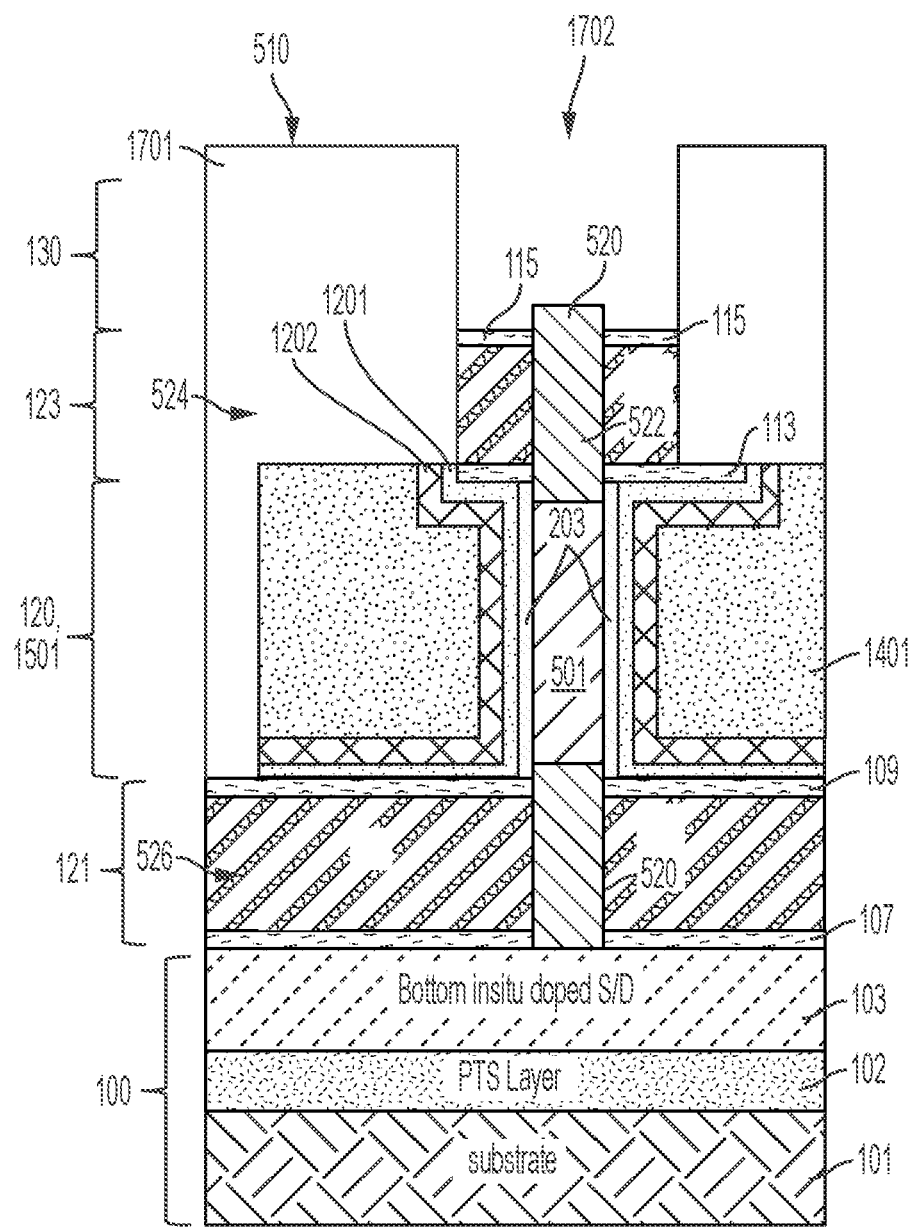

Referring to FIG. 16, the channel cap 701 and top spacer 901 are removed. Accordingly, an ILD void 1702 is formed in the ILD 1701, which exposes the upper surface of dielectric layer 115 along with an upper portion of the upper source/drain extension region 520. The top spacer 901 and channel cap 701 can be etched selectively using well-known current state-of-the-art techniques RIE or atomic layer etch (ALE) using fluoride-based chemicals such as, for example fluoroform (CHF3).

Figure 17:
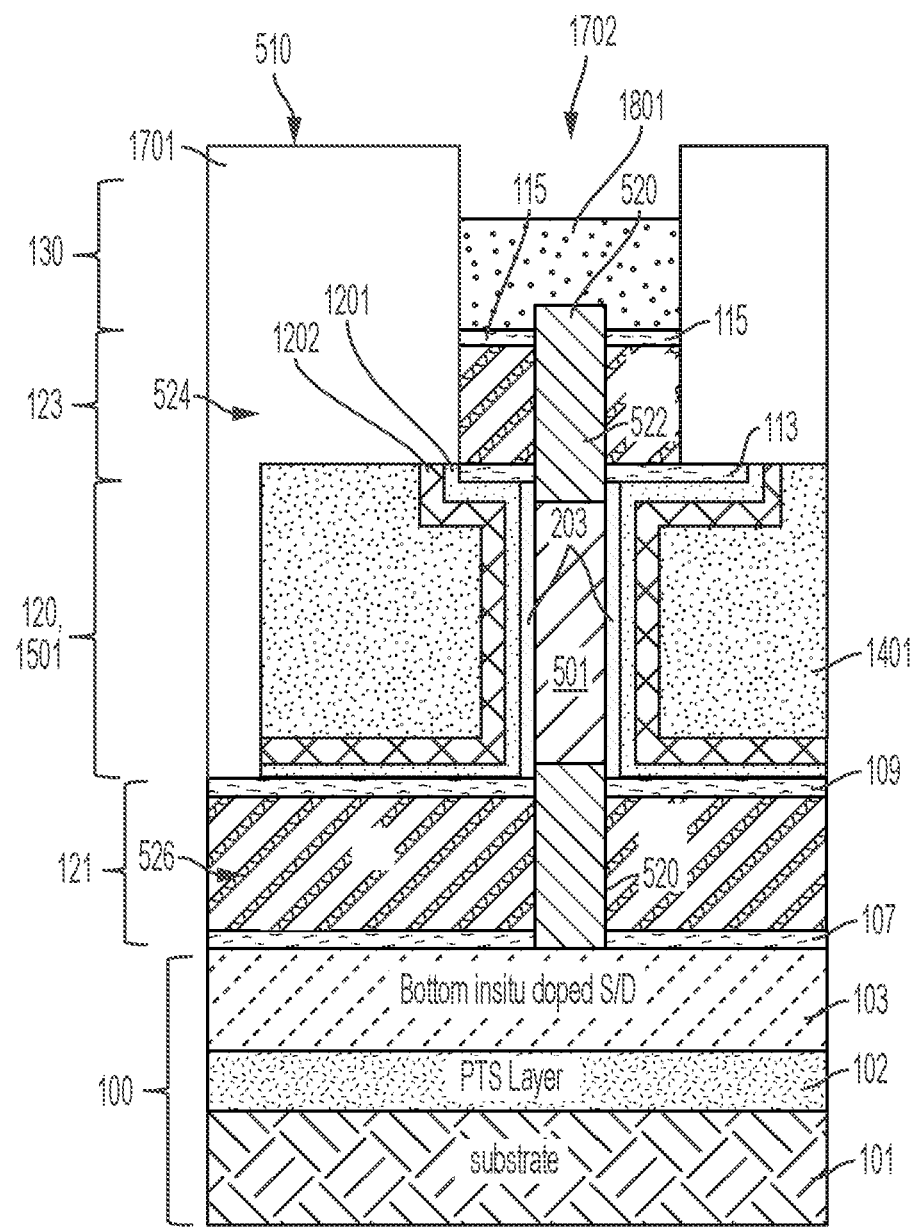

Turning to FIG. 17, a second source/drain region 1801 is epitaxially grown from the upper portion of the epitaxial channel 501. The second source/drain region 1801 can be epitaxially grown using a suitable growth process, for example, chemical vapor deposition (CVD) (liquid phase (LP) or reduced pressure chemical vapor deposition (RPCVD), vapor-phase epitaxy (VPE), molecular-beam epitaxy (MBE), liquid-phase epitaxy (LPE), metal organic chemical vapor deposition (MOCVD), or other suitable processes.

The second source/drain region 1801 can be heavily doped with a dopant, which can be a p-type dopant (e.g., boron or gallium) or an n-type dopant (e.g., phosphorus or arsenic) so as to serve as a drain region for a completed VTFET. In one or more non-limiting embodiments of the invention, the second source/drain region 1801 has a dopant concentration ranging, for example, from about 1019 to about 1022 atoms/cm.

The sources for the epitaxial channel material can be, for example, silicon, germanium, or a combination thereof. The gas source for the deposition of epitaxial semiconductor material can include a silicon-containing gas source, a germanium-containing gas source, or a combination thereof. For example, an epitaxial silicon layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. An epitaxial silicon germanium alloy layer can be formed utilizing a combination of such gas sources. Carrier gases like hydrogen, nitrogen, helium and argon can be used.

Figure 18:
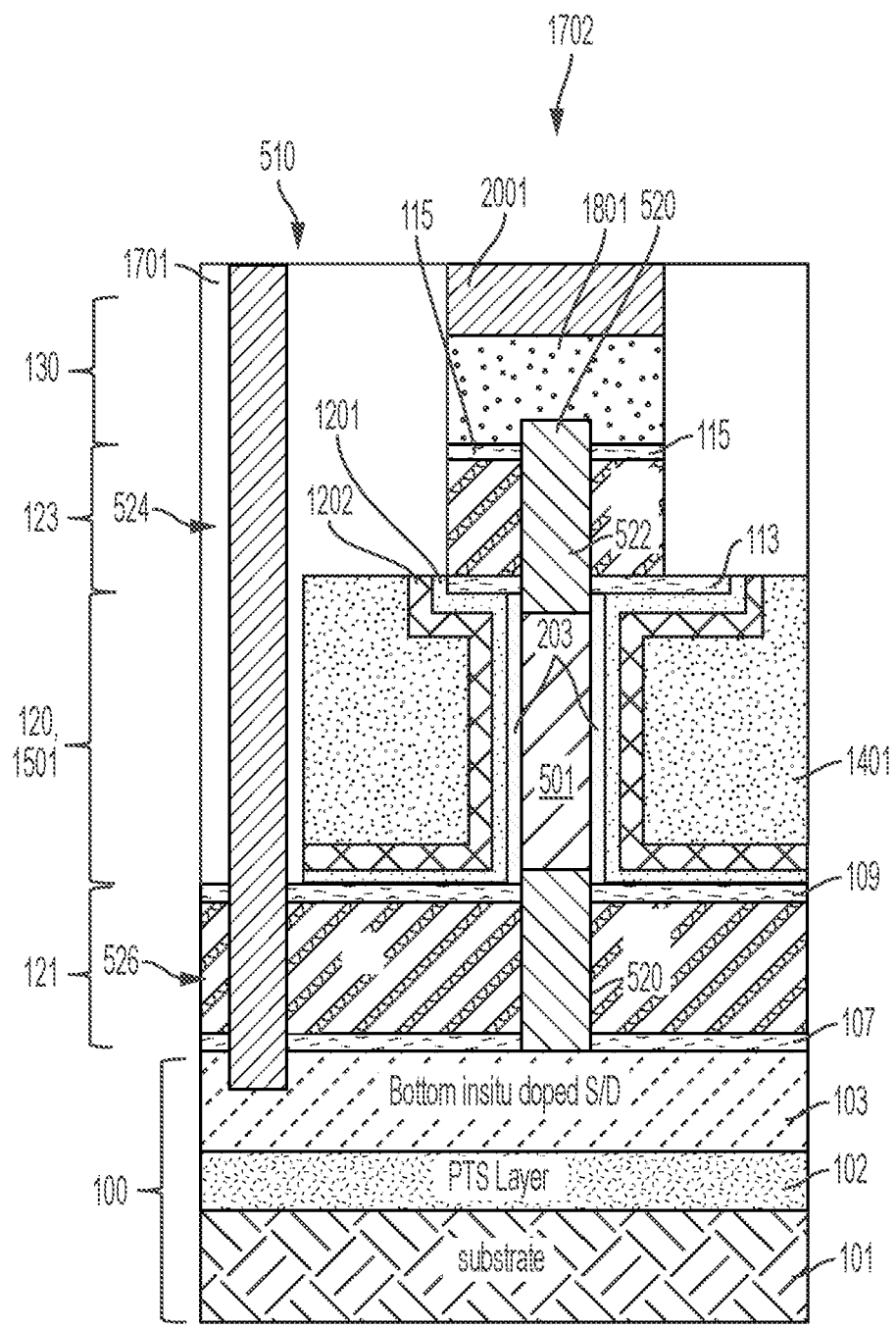

Referring to FIG. 18, a top contact 2001 is formed to contact the second source/drain region 1801 (e.g., the drain region 1801) and a bottom contact 2002 is formed to contact the first source/drain region 103. The top contact 2001 is formed by depositing an electrically conductive material in the ILD void 1702 and on an upper surface of the second source/drain region 1801. The bottom contact 2002 is formed by etching a contact trench (not shown) through the ILD 1701 and the first spacer stack 121 until a portion of the first source/drain region 103 is exposed. An electrically conductive material can then be deposited in the contact trench to form a bottom contact 2002 that directly contacts the first source/drain region 103.

The electrically conductive material used for the top and bottom contacts 2001 and 2002 can be a conductive metal, for example, aluminum (Al), platinum (Pt), gold (Au), tungsten (W), titanium (Ti), or any combination thereof. The conductive material can be deposited by a suitable deposition process, for example, CVD, PECVD, PVD, plating, thermal or e-beam evaporation, or sputtering. A planarization process, for example, CMP, can be performed to remove any conductive material from the surface of the ILD 1701.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the detailed description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

As previously noted herein, for the sake of brevity, conventional techniques related to semiconductor device and IC fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A semiconductor device comprising:
   a first source/drain region on an upper surface of a semiconductor substrate that extends along a first direction to define a length and a second direction orthogonal with respect to the first direction to define a width;
   a channel region extending vertically in a direction perpendicular to the first and second directions from a first end contacting the first source/drain region to an opposing second end contacting a second source/drain region;
   a first doped source/drain extension region located between the first source/drain region and the channel portion;
   a second doped source/drain extension region located between the second source/drain region and the channel portion
   a first spacer stack interposed between the first source/drain region and the gate, the first spacer stack including a first dielectric layer and a second dielectric layer separated from the first dielectric layer; and
   a second spacer stack interposed between the second source/drain region and the gate, the second spacer stack including a third dielectric layer and a fourth dielectric layer separated from the third dielectric layer.

2. The semiconductor device of claim 1 further comprising a gate surrounding a channel portion of the channel region.

3. The semiconductor device of claim 1, wherein the first doped source/drain extension region has a first thickness extending along the vertical direction, and the second doped source/drain extension region has a second thickness extending along the vertical direction.

4. The semiconductor device of claim 3, wherein the first source/drain extension region extends through the first spacer stack, and wherein the second source/drain extension region extends completely the second spacer stack.

5. The semiconductor device of claim 4, wherein the gate is between the first spacer stack and the second spacer stack.

6. The semiconductor device of claim 5, wherein the first source/drain extension region extends through the gate and completely through the first spacer stack, and wherein the second source/drain extension region extends through the gate and completely the second spacer stack.

7. The semiconductor device of claim 6, wherein the gate includes an epitaxial channel.

8. The semiconductor device of claim 7, wherein the epitaxial channel is between the first source/drain extension region and the second source/drain extension region.

9. The semiconductor device of claim 8, wherein the epitaxial channel includes a first channel end that contacts a first extension end of the first source/drain extension region and includes a second channel end that contacts a first extension end of the second source/drain region.

10. The semiconductor device of claim 9, wherein an opposing second extension end of the first source/drain extension region contacts the first source/drain region.

11. The semiconductor device of claim 10 further comprising a punch through stop (PTS) layer between the first source/drain region and the substrate.

12. The semiconductor device of claim 10, wherein an opposing second extension end of the second source/drain extension region contact the second source/drain region.

13. The semiconductor device of claim 10, wherein the first spacer stack includes a first dielectric portion that is interposed between the first and second dielectric layers and that surrounds the first source/drain extension region, and wherein the second spacer stack includes a second dielectric portion that is interposed between the third and fourth dielectric layers and that surrounds the second source/drain extension region.

14. The semiconductor device of claim 1, wherein a first dopant concentration of the first and second source/drain extension regions is different from a second doping concentration the channel portion.

* * * * *